US011081173B2

(12) United States Patent
Tang

(10) Patent No.: US 11,081,173 B2
(45) Date of Patent: Aug. 3, 2021

(54) VIA FORMATION FOR CROSS-POINT MEMORY

(71) Applicant: Micron Technology, Inc., Boise, ID (US)

(72) Inventor: Stephen Tang, Fremont, CA (US)

(73) Assignee: Micron Technology, Inc., Boise, ID (US)

( * ) Notice: Subject to any disclaimer, the term of this patent is extended or adjusted under 35 U.S.C. 154(b) by 118 days.

(21) Appl. No.: 16/387,183

(22) Filed: Apr. 17, 2019

(65) Prior Publication Data

US 2019/0318780 A1 Oct. 17, 2019

Related U.S. Application Data

(60) Continuation of application No. 15/280,238, filed on Sep. 29, 2016, now Pat. No. 10,311,947, which is a continuation of application No. 13/870,434, filed on Apr. 25, 2013, now Pat. No. 9,484,534, which is a division of application No. 12/648,979, filed on Dec. 29, 2009, now Pat. No. 8,431,446.

(51) Int. Cl.
| | |
|---|---|
| G11C 13/00 | (2006.01) |
| H01L 45/00 | (2006.01) |
| H01L 27/10 | (2006.01) |
| H01L 27/24 | (2006.01) |
| H01L 23/48 | (2006.01) |
| H01L 23/528 | (2006.01) |

(52) U.S. Cl.
CPC ...... *G11C 13/0004* (2013.01); *G11C 13/0002* (2013.01); *G11C 13/003* (2013.01); *H01L 23/481* (2013.01); *H01L 23/528* (2013.01); *H01L 27/101* (2013.01); *H01L 27/2463* (2013.01); *H01L 45/06* (2013.01); *H01L 45/124* (2013.01); *H01L 45/1253* (2013.01); *H01L 45/1683* (2013.01); *H01L 27/249* (2013.01); *H01L 27/2481* (2013.01); *H01L 45/1233* (2013.01); *H01L 45/1675* (2013.01); *H01L 2924/0002* (2013.01)

(58) Field of Classification Search
None
See application file for complete search history.

(56) References Cited

U.S. PATENT DOCUMENTS

| | | | |
|---|---|---|---|
| 5,985,752 A | 11/1999 | Chang | |
| 7,335,906 B2 | 2/2008 | Toda | |
| 7,639,521 B2 | 12/2009 | Baek et al. | |
| 7,920,408 B2 | 4/2011 | Azuma et al. | |
| 8,105,884 B2 | 1/2012 | Lee et al. | |
| 8,431,446 B1 * | 4/2013 | Tang | G11C 13/0004 438/129 |
| 8,829,646 B2 | 9/2014 | Lung et al. | |
| 2006/0186483 A1 | 8/2006 | Cho et al. | |
| 2008/0258129 A1 | 10/2008 | Toda | |
| 2008/0277643 A1 | 11/2008 | Chang | |
| 2009/0027938 A1 | 1/2009 | Wells | |
| 2009/0134431 A1 | 5/2009 | Tabata et al. | |
| 2009/0230556 A1 | 9/2009 | Mikawa et al. | |
| 2014/0312294 A1 | 10/2014 | Lee | |

* cited by examiner

*Primary Examiner* — Andres Munoz
(74) *Attorney, Agent, or Firm* — Holland & Hart LLP

(57) ABSTRACT

Embodiments disclosed herein may relate to electrically conductive vias in cross-point memory array devices. In an embodiment, the vias may be formed using a lithographic operation also utilized to form electrically conductive lines in a first electrode layer of the cross-point memory array device.

18 Claims, 7 Drawing Sheets

A

B

C

VIA FORMATION FOR CROSS-POINT MEMORY

REFERENCE TO RELATED APPLICATIONS

This application is a continuation of U.S. patent application Ser. No. 15/280,238 by Tang, entitled "Via Formation for Cross-Point Memory," filed Sep. 29, 2016, which is a continuation of U.S. patent application Ser. No. 13/870,434 by Tang, entitled "Via Formation for Cross-Point Memory," filed Apr. 25, 2013, which is a divisional of U.S. patent application Ser. No. 12/648,979 by Tang, entitled "Via Formation for Cross-Point Memory," filed Dec. 29, 2009, assigned to the assignee hereof, and each of which is expressly incorporated by reference herein.

BACKGROUND

Subject matter disclosed herein may relate to integrated circuit devices, and may relate more particularly to forming vias in a cross-point memory device.

Integrated circuit devices, such as non-volatile memory devices, for example, may be found in a wide range of electronic devices. For example, non-volatile memory devices may be used in computers, digital cameras, cellular telephones, personal digital assistants, etc. Factors related to a memory device that may be of interest to a system designer in considering the memory device's suitability for any particular application may include, physical size, storage density, operating voltages, granularity of read/write operations, data throughput, data transmission rate, and power consumption. Other example factors that may be of interest to system designers include cost of manufacture, and ease of manufacture. Process technologies utilized to manufacture a memory device may at least in part determine at least some of the factors mentioned above, including storage density, physical size, and cost/ease of manufacture, for example.

BRIEF DESCRIPTION OF THE DRAWINGS

Claimed subject matter is particularly pointed out and distinctly claimed in the concluding portion of the specification. However, both as to organization and/or method of operation, together with objects, features, and/or advantages thereof, it may best be understood by reference to the following detailed description if read with the accompanying drawings in which:

Reference is made in the following detailed description to the accompanying drawings, which form a part hereof, wherein like numerals may designate like parts throughout to indicate corresponding or analogous elements. It will be appreciated that for simplicity and/or clarity of illustration, elements illustrated in the figures have not necessarily been drawn to scale. For example, the dimensions of some of the elements may be exaggerated relative to other elements for clarity. Further, it is to be understood that other embodiments may be utilized. Furthermore, structural or logical changes may be made without departing from the scope of claimed subject matter. It should also be noted that directions or references, for example, up, down, top, bottom, and so on, may be used to facilitate discussion of the drawings and are not intended to restrict the application of claimed subject matter. Therefore, the following detailed description is not to be taken to limit the scope of claimed subject matter or their equivalents.

DETAILED DESCRIPTION

In the following detailed description, numerous specific details are set forth to provide a thorough understanding of claimed subject matter. However, it will be understood by those skilled in the art that claimed subject matter may be practiced without these specific details. In other instances, methods, apparatuses or systems that would be known by one of ordinary skill have not been described in detail so as not to obscure claimed subject matter.

As discussed above, integrated circuit devices such as non-volatile memory devices may be found in a wide range of electronic devices. Non-volatile memory devices may be used in computers, digital cameras, cellular telephones, and personal digital assistants, to name but a few examples. As also previously mentioned, factors related to a memory device that may be of interest to a system designer in considering the memory device's suitability for a particular application may include, physical size, storage density, operating voltages, granularity of read/write operations, data throughput, data transmission rate, and power consumption. Other example factors that may be of interest to system designers include cost of manufacture, and ease of manufacture. Process technologies utilized to manufacture a memory device may at least in part determine at least some of the factors mentioned above, including storage density, physical size, and cost/ease of manufacture, for example.

Figure 1:
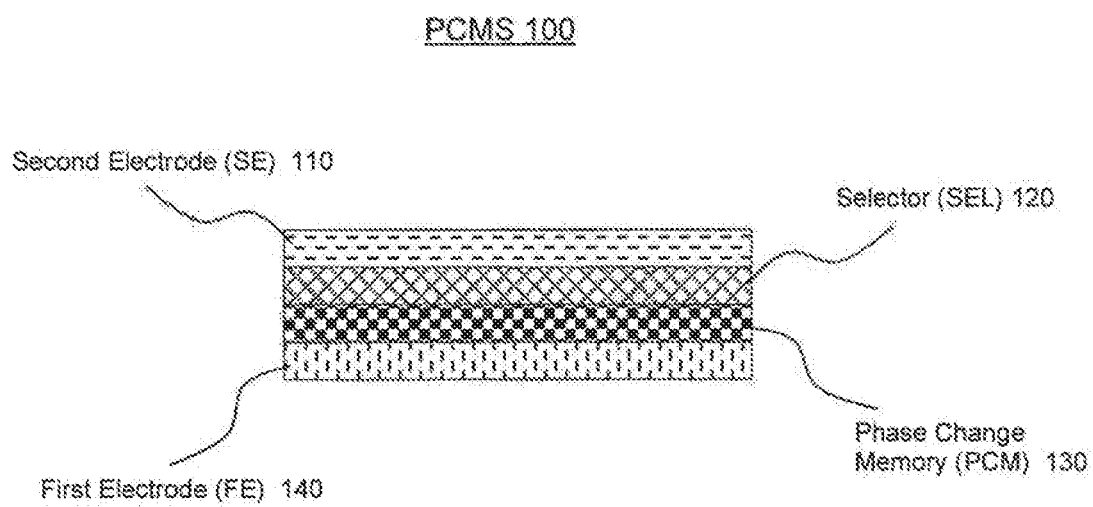
FIG. 1 is an illustration depicting a cross-sectional view of an example embodiment of a phase change memory with a selector.

FIG. 1 is an illustration depicting a cross-sectional view of an example embodiment of a phase change memory with selector (PCMS) 100. For the present example embodiment, PCMS 100 is implemented as a cross-point memory array. In a PCM cross-point memory array, two layers of orthogonal electrically conductive lines may be formed, with one layer of electrically conductive lines formed at the bottom of a memory stack and another layer of electrically conductive lines running in an orthogonal direction formed in a top layer of the memory stack. In an embodiment, the bottom layer of electrically conductive lines may be referred to as a first electrode (FE) layer 140, and the top layer of electrically conductive lines may be referred to a second electrode (SE) layer 110. The electrically conductive lines of FE layer 140 may run in a direction that is orthogonal to the direction of the electrically conductive lines of SE layer 110. Also for an embodiment, and as depicted in FIG. 1, a layer of PCM memory cells (130) and a layer of selector devices (SEL) 120 may be located between layers FE 140 and SE 110 to form a PCMS memory stack 100. In some embodiments, additional PCM, SEL, and SE layers may be formed to create embodiments of memory devices with multiple PCMS memory layers in a stack. In such embodiments, a SE layer for one PCMS layer may be utilized as a FE layer for an additional PCMS layer.

In one or more embodiments, cross-point memory arrays may be implemented using technologies other than PCM, such as resistive memory technologies and/or other types of memory, and the scope of claimed subject matter is not limited in this respect. One potential benefit of a cross-point memory array is that memory cells may be defined at least in part by lines formed at a minimum geometry for a given manufacturing process, potentially allowing for a greater storage density, increased storage capacity, and/or reduced die size, for example. For example, if lines are created at a minimum width for both first and second wire layers, memory cells may have an area of $4f^2$, where 'f' represents the minimum line width for the process. In some embodiments, memory cells may store more than one bit of information, so the effective memory cell size may be less than $4f^2$. Of course, the scope of claimed subject matter is not limited in these respects, and embodiments are possible using lines and/or other features having widths greater than a minimum width for a given manufacturing technology.

Figure 2:
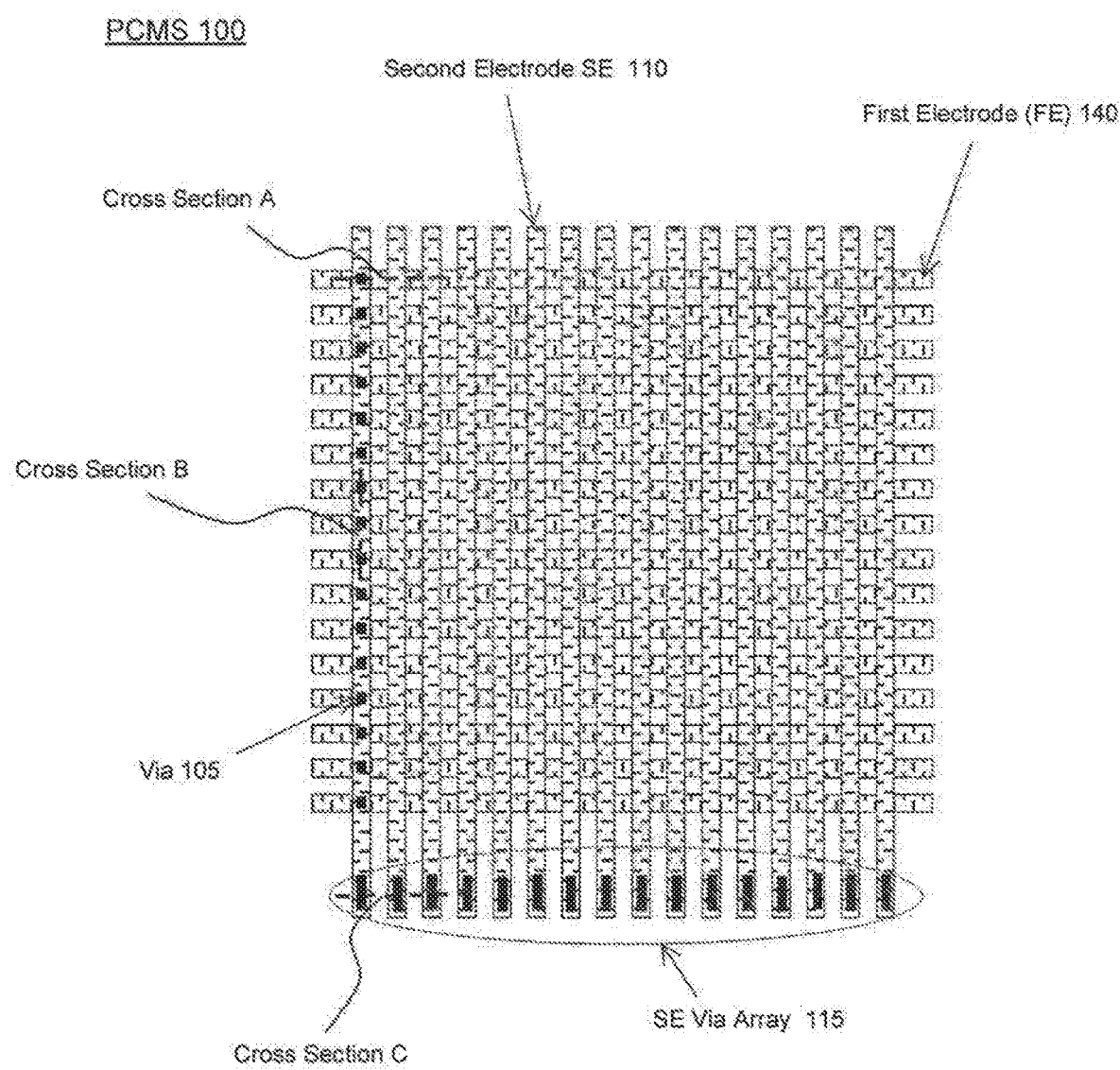
FIG. 2 is an illustration depicting a top view of a portion of an example embodiment of a cross-point memory array device.

FIG. 2 is an illustration depicting a top view of a portion of example PCMS cross-point memory array 100. Depicted in FIG. 2 is SE layer 110 comprising a number of electrically conductive lines running in a vertical fashion for this illustration and FE layer 140 having electrically conductive lines running in a horizontal fashion for this illustration. For an embodiment, a memory cell from PCMS layer 130 may be selected and/or accessed by energizing appropriate electrically conductive lines in FE layer 140 and/or SE layer 110. For an example PCMS cross-point memory array, circuitry tasked with providing electrical signals to the word-lines and/or bit-lines of FE layer 140 and/or SE layer 110 may be positioned beneath the memory array, in an embodiment. Also for an embodiment, the signal generation circuitry may be implemented as CMOS circuitry, although the scope of claimed subject matter is not limited in this respect. In order to electrically connect the signal generation circuitry to FE 140, electrically conductive vias such as 105 and/or 115 may be formed in an encapsulating material (not shown). For an embodiment, vias 115 may be extended up to SE layer 110 in order to provide signals from the signal generation circuitry to SE 110. The formation of two-dimensional vias such as those utilized to electrically conduct signals to SE 110 may represent a challenge in manufacturing cross-point memory array devices, due at least in part to limitations and/or difficulties that may be experienced in utilizing two-dimensional lithographic capabilities to form vias that line up with one-dimensional lines that may make up the FE and SE layers.

In an embodiment, a technique may be utilized to form vias having approximately the same pitch as electrically conductive lines from layers FE 140 or SE 110. The vias may be formed as part of a technique, in an example embodiment, wherein memory cells and their interconnects, such as word-lines and/or bit-lines, may be formed using a subtractive etch technique. Vias may be defined at least in part by lines patterned in one or more layers, wherein the vias are formed without utilizing an additional lithographic process to pattern the vias. A relatively less accurate lithographic process may be utilized, in an example embodiment, to protect the memory array at least in part during formation of the vias, although the scope of claimed subject matter is not limited in this respect. An example technique for forming vias is described below.

In an embodiment, a cross-point memory array may be formed by generating a first electrode layer and a memory material layer. For a PCMS memory array, a selector device layer may be formed on the memory material layer. Prior to forming a second electrode layer of electrically conductive lines that are oriented in a direction that is orthogonal to the direction of the lines of the first electrode layer, memory layer material, including material from the selector layer in the case of a PCMS, may be removed from areas in which it is desired to create one or more vias. Memory layer material and/or selector layer material in the case of a PCMS may not be removed in one or more areas outside of the areas in which it is desired to create one or more vias, for an example embodiment. Electrically conductive material may be deposited in the areas where the memory material was removed in order to create the vias, and a second electrode layer may be formed over the remaining memory material and over the vias. Of course, this is merely an example embodiment of a technique for forming vias in a cross-point memory array device, and the scope of claimed subject matter is not limited in these respects. Other embodiments are described below in more detail.

FIGS. 3a through 3f, described below, depict cross-sectional views of several portions of PCMS 100 as PCMS 100 undergoes various example stages of fabrication. FIG. 2 shows cross-sectional line segments 'A', 'B', and 'C' that correspond to cross sectional views A, B, and C depicted in FIGS. 3a through 3f. Note that FIG. 2 depicts SE 110 and FE 140 of PCMS 100 post-fabrication. FIGS. 3a through 3f depict an example technique for forming at least some elements of PCMS 100.

Figure 3A:
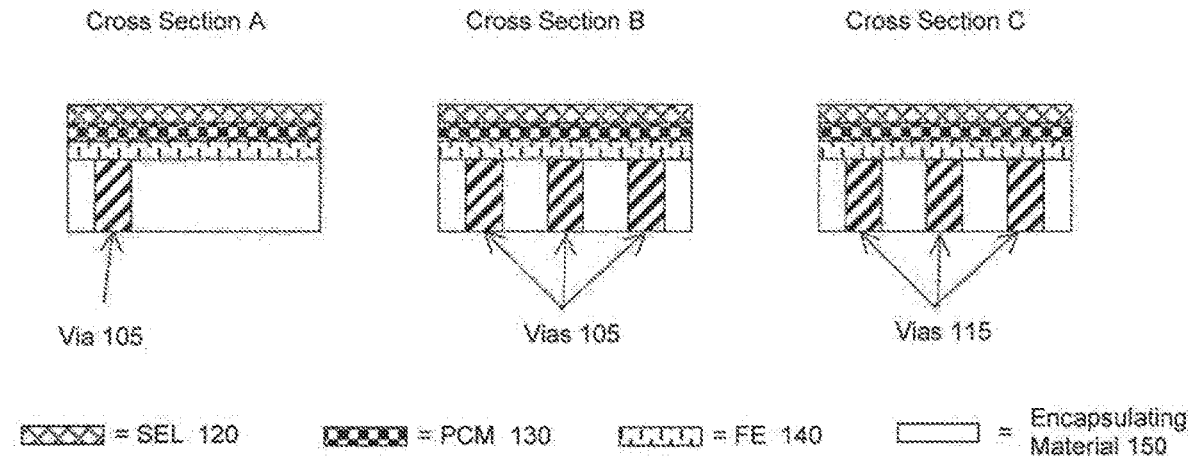
FIG. 3a is an illustration depicting a portion of an example technique for forming vias in an example embodiment of a cross-point memory array device.

FIG. 3a is an illustration depicting an aspect of an example embodiment of a technique for forming vias as part of an example fabrication of PCMS cross-point memory array 100. Please refer to FIG. 2 for cross-sectional line segments 'A', 'B', and 'C' corresponding to cross-sectional views A, B, and C depicted in FIG. 3a. As illustrated in FIG. 3a, a stack comprising a first electrode layer FE 140, a memory material layer 130, and a selector material layer SEL 120 may be deposited or otherwise formed on a wafer including a substrate comprising encapsulating material 150. For an embodiment, memory material layer 130 may comprise phase change memory (PCM). Also for an embodiment, encapsulating material 150 may comprise a thick oxide material, although the scope of claimed subject matter is not limited in this respect. For this example embodiment, FIG. 3a also depicts via 105 in cross-sectional view A, depicts additional vias 105 in cross-sectional view B, and also depicts vias 115 in cross-sectional view C. Note that layers 110, 120, and 130 as shown in FIG. 3a are blanket deposited and have not yet been patterned at this point in the example fabrication.

Figure 3B:
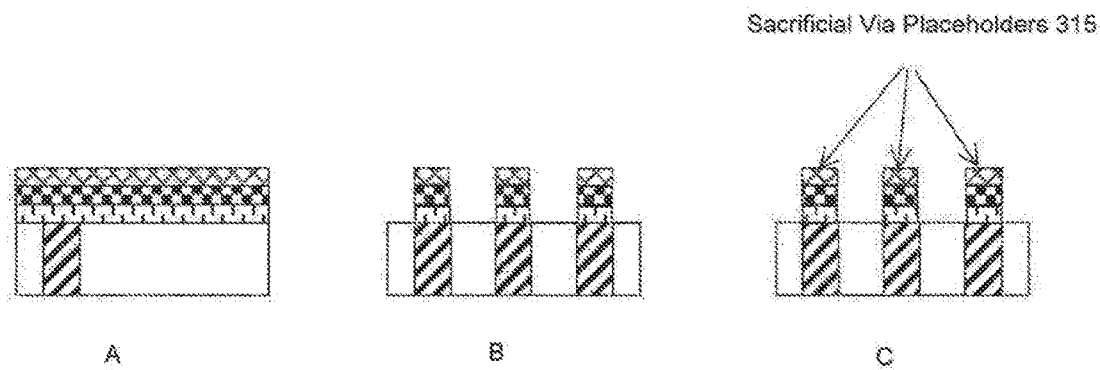
FIG. 3b is an illustration depicting an additional portion of an example technique for forming vias in an example embodiment of a cross-point memory array device.

FIG. 3b is an illustration depicting an additional aspect of an example fabrication technique for example memory device PCMS 100, including forming vias according to an example embodiment. As depicted in FIG. 3b, lines may be patterned in a first direction, which, for the example depicted in FIG. 3a, comprises lines in the horizontal direction as seen in FIG. 2. Of course, the use of directions such as "horizontal", "vertical", "up", "down", "left", "right", etc. do not limit the scope of claimed subject matter, but are used herein merely to facilitate discussion and explanation. As seen in FIG. 3b, horizontal lines may be patterned in FE 140, SEL 120, and PCM 130. As also depicted in FIG. 3b, in particular view C, material from layers 140, 130, and 120 may also be patterned to form what may be referred to a "sacrificial via placeholders" 315 that will be used to define vias 115 that extend to SE 110, as is discussed more fully below. For an embodiment, sacrificial via placeholders 315 may be formed by patterning relatively short line segments extending in a direction substantially orthogonal to the horizontal lines, although the scope of claimed subject matter is not limited in this respect. For one or more other embodiments, the relatively short line segments forming sacrificial via placeholders 315 may extend in a direction that is not substantially orthogonal to the lines of FE 140. Also, it may be noted that those line segments serving as placeholders 315 for future vias may be patterned in an area outside of the area utilized for the memory cell array. Please refer to the SE via array 115 shown in FIG. 2 and cross-section line segment 'C' to see an example of where the sacrificial via placeholders may be patterned, in an example embodiment. Also, in an embodiment, horizontal lines and sacrificial via placeholder 315 may be patterned using a subtractive etch technique, although the scope of claimed subject matter is not limited in this respect.

Figure 3C:
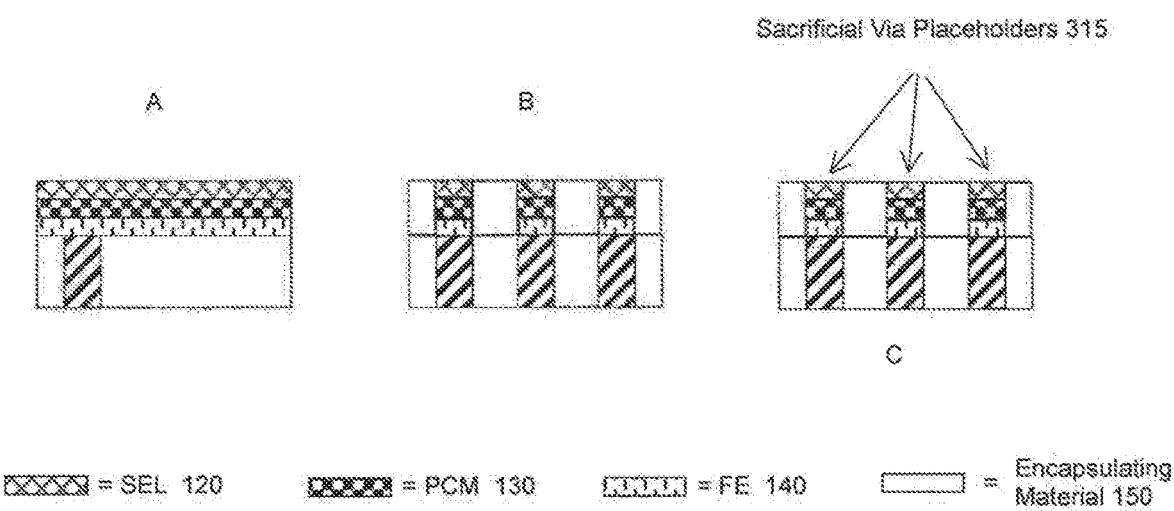
FIG. 3c is an illustration depicting another portion of an example technique for forming vias in an example embodiment of a cross-point memory array device.

FIG. 3c is an illustration depicting another aspect of an example fabrication technique for example memory device PCMS 100, including forming vias according to an example embodiment. As shown in FIG. 3c, encapsulating material 150 may be deposited over the memory stack, filling the gaps formed as a result of the patterning of the horizontal lines and sacrificial via placeholders 315 depicted in FIG. 3b. For the present example embodiment, encapsulating material 150 may comprise a dielectric material such as a thick oxide, for example, although the scope of claimed subject matter is not limited in this respect. Also, as further depicted in FIG. 3c, the wafer may be planarized so that the top surface is flat. In an embodiment, a chemical mechanical polishing technique may be utilized to planarize the top surface, although the scope of claimed subject matter is not limited in this respect.

Figure 3D:
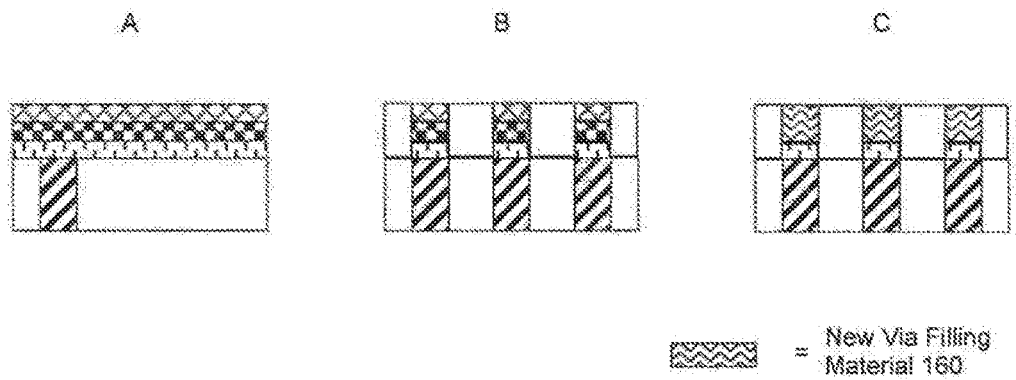
FIG. 3d is an illustration depicting a further portion of an example technique for forming vias in an example embodiment of a cross-point memory array device.

FIG. 3d is an illustration depicting a further aspect of an example fabrication technique for example memory device PCMS 100, including forming vias according to an example embodiment. As depicted in FIG. 3d, particularly at view C, the SEL 130 and PCM 120 material at the site of the sacrificial via placeholders 315 may be etched out. See SE via array 115 in FIG. 2 for a top view of the area under discussion, in addition to view C from FIG. 3d. For an embodiment, the etching process stops at the FE layer 140. A lithography operation may be performed to protect the memory array outside of SE via array 115 area to avoid etching memory and selector layer material in the memory array during the etching process. An electrically conductive new via filling material 160 may be deposited in the etched areas in order to form vias 115. Note that the dimensions of vias 115 were defined at least in part by previously patterned elements. For an embodiment, new via filling material 160 may comprise tungsten or copper, for example, although the scope of claimed subject matter is not limited in this respect. Also, for an embodiment, the wafer may be polished in order to planarize the top surface, although again, the scope of claimed subject matter is not limited in this respect.

Figure 3E:
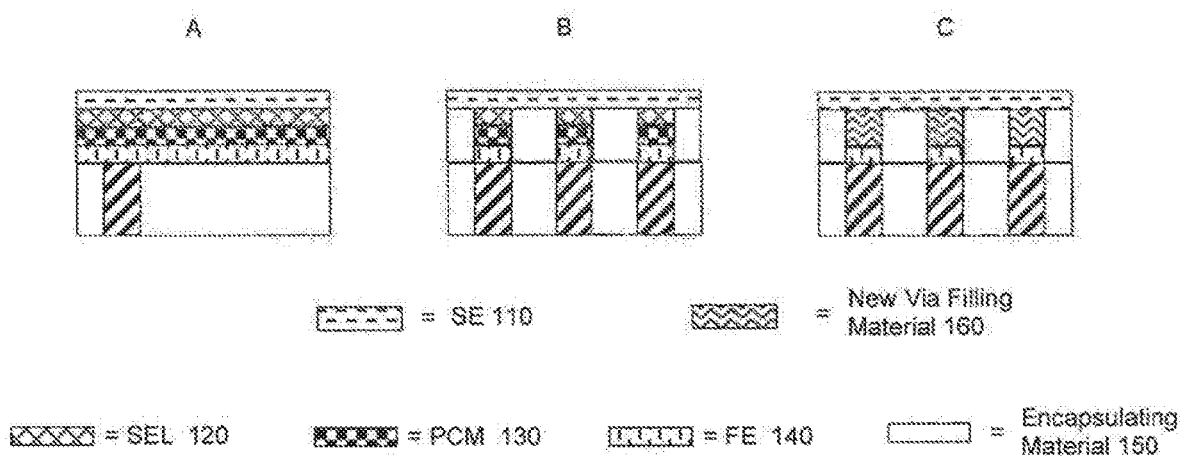
FIG. 3e is an illustration depicting an additional portion of an example technique for forming vias in an example embodiment of a cross-point memory array device.

FIG. 3e is an illustration depicting an additional aspect of an example fabrication technique for example memory device PCMS 100, including forming vias according to an example embodiment. As seen in FIG. 3e, SE layer material 110 may be deposited over the structure. For an embodiment, SE layer material 110 may comprise an electrically conductive material, such as aluminum, for example. However, the scope of claimed subject matter is not limited in this respect.

Figure 3F:
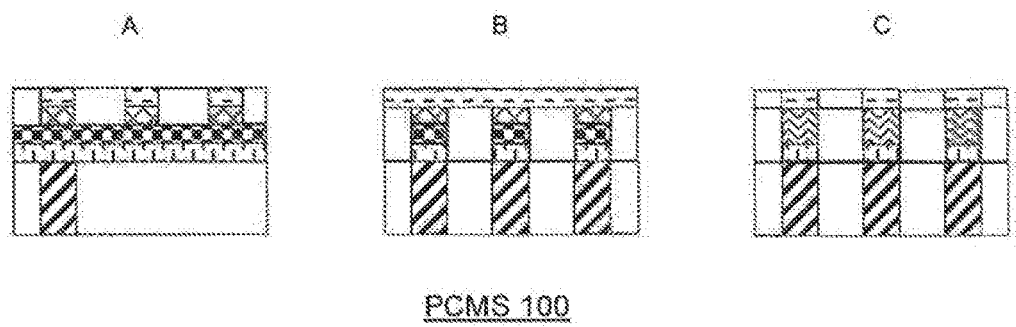
FIG. 3f is an illustration depicting another portion of an example technique for forming vias in an example embodiment of a cross-point memory array device.

FIG. 3f is an illustration depicting another aspect of an example fabrication technique for example memory device PCMS 100, including forming vias according to an example embodiment. As discussed above in connection with FIG. 3e, SE layer 110 may be deposited over the structures of PCMS 100. As further depicted in FIG. 3f, electrically conductive lines maybe patterned in SE 110, wherein the lines may be formed to run in a direction orthogonal to the lines in FE layer 140. For an embodiment, a subtractive etch technique may be utilized to pattern the lines of SE 110, although the scope of claimed subject matter is not limited in this respect. The subtractive etch technique for an embodiment may etch through the SE 110 and SEL 120 layers. The etch may stop on or partially through PCM layer 130, for an embodiment. Also for an embodiment, the electrically conductive lines of SE 110 may serve as bit-lines for the PCMS memory array, and the electrically conductive lines of FE 140 may serve as word-lines. However, the scope of claimed subject matter is not limited in these respects.

As further depicted in FIG. 3f, particularly at views A and C, the structures of PCMS 100 may be encapsulated by encapsulating material 150, and the wafer may be further planarized through utilization of a chemical mechanical polishing technique, for an example embodiment. Note that FIG. 3f illustrates a completed example fabrication of example memory device PCMS 100. For the new vias formed as part of SE via array 115, note that the width and location of the vias are determined at least in part by the patterned lines of FE 140, for an example embodiment.

For the example embodiments described above in connection with FIGS. 1 through 3f, vias 115 are described has being formed without the utilization of a separate lithographic patterning operation. For the embodiments described above, two or more lithographic patterning operations may be performed. A first lithographic patterning operation may be performed at the aspect illustrated at FIG. 3b, wherein electrically conductive lines for FE layer 140 are formed and wherein sacrificial via placeholders 315 may be formed. Vias 115 may be formed as depicted at FIGS. 3c and 3d without utilizing an additional lithographic patterning operation. Rather, the vias may be formed by filling trenches formed by etching away SEL 120 and PCM 130 layer materials from the areas defined by sacrificial via placeholders 315 with electrically conductive material. As mentioned previously, for an embodiment, a relatively less accurate lithographic process may be utilized to protect memory layer material and/or selector layer material in the memory array from being etched during the etching of the sacrificial via placeholders 315. A second lithographic patterning operation is depicted at FIG. 3e wherein electrically conductive lines for SE 110 may be patterned. By utilizing features patterned with the first lithographic operation to define at least in part vias 115, vias 115 may be substantially aligned with the electrically conductive lines for FE 140 with an improved level of precision as compared to vias that may be formed using an additional two-dimensional lithographic patterning operation.

Figure 4:
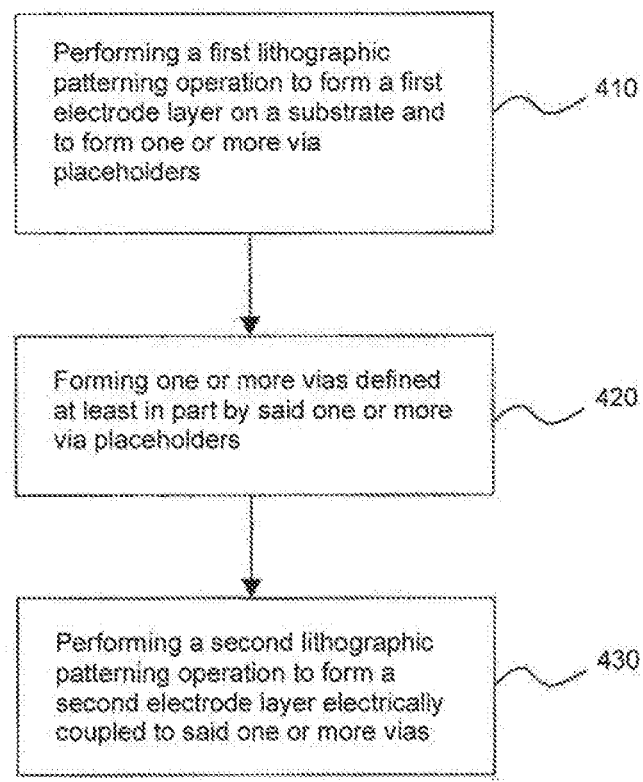
FIG. 4 is a flow diagram illustrating an example embodiment of a process for forming vias in an example embodiment of a cross-point array memory device.

FIG. 4 is a flow diagram illustrating an example embodiment of a process for forming vias in an example embodiment of a cross-point array memory device. At block 410, a first lithographic patterning operation may be performed to form a first electrode layer on a substrate and to form one or more via placeholders. One or more vias defined at least in part by said one or more via placeholders may be formed at block 420. At block 430, a second lithographic patterning operation may be performed to form a second electrode layer electrically coupled to the one or more vias. Embodiments in accordance with claimed subject matter may include all of, more than, or less than blocks 410-430. Additionally, the order of blocks 410-430 is merely an example order, and the scope of claimed subject matter is not limited in this respect.

As described above, example embodiments may comprise depositing layers of PCM memory material and selector material over an encapsulating material substrate. Lines may be formed in the first electrode layer, PCM layer, and selector layer in a first direction as an aspect of a process for forming an array of PCM memory cells. Such lines may be formed through a lithographic technique by which sacrificial via placeholders may also be formed. The sacrificial via placeholders are named as such because the placeholders are removed in another aspect of the fabrication in order to provide holes that may be filled with electrically conducting material to form vias. Lines may further be formed in the memory and selector layers, and well as in a second electrode layer, that run in a direction substantially orthogonal to the lines formed in the first electrode layer. The substantially orthogonal pair of sets of lines may create a cross-point memory array, with vias extending from the first electrode layer to the second electrode layer. Because such vias may be formed using lithographic techniques that are utilized to form minimum width lines, the vias may be formed with greater accuracy and precision than would otherwise be possible using conventional two-dimensional lithographic techniques. As mentioned previously, for an embodiment, a lithographic technique may be utilized to protect a memory array while sacrificial via placeholders are removed. However, in an embodiment, such lithographic technique to protect the memory array need not be of the same level of precision as the techniques utilized to form the lines and sacrificial placeholder vias. Further, for an embodiment, multiple stacks of memory may be utilized, and vias may be formed at least in part through use of one or more embodiments such as those described herein, and such via may extend through the multiple stacks. However, the scope of claimed subject matter is not limited in this respect.

Figure 5:
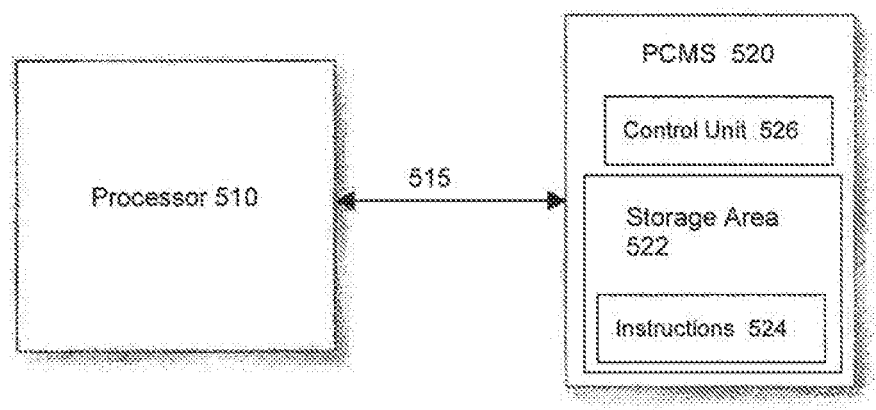
FIG. 5 is a schematic block diagram depicting an example embodiment of a system including an example embodiment of a non-volatile cross-point array memory device.

FIG. 5 is a schematic block diagram depicting an example embodiment of a computing platform system 500 including an example embodiment of a non-volatile cross-point memory array device 520. In an embodiment, the non-volatile memory 520 may comprise a PCMS cross-point memory array device that may be implemented in accordance with one or more of the embodiments. PCMS 520 may be coupled in an embodiment to a processor 510 by way of an interconnect 515.

PCMS 520 in an embodiment may comprise a control unit 526, as well a storage area 522. Storage area 522 for an embodiment may comprise an array of PCMS memory cells. Further, storage area 522 may be implemented as a cross-point array of PCMS memory cells, in an embodiment. Also in an embodiment, storage area 522 may store instructions 524 that may include one or more applications that may be executed by processor 510. In an embodiment, processor 510 may transmit a memory access command to PCMS 520. Control unit 526 may, for an embodiment, access one or more memory cells of storage area 522 at least in part in response to receiving the memory access command from processor 510. Of course, computing platform 500 is merely one example of a system implemented in accordance with claimed subject matter, and the scope of claimed subject matter is not limited in these respects.

The term "computing platform" as used herein refers to a system or a device that includes the ability to process or store data in the form of signals. Thus, a computing platform, in this context, may comprise hardware, software, firmware or any combination thereof. Computing platform 500, as depicted in FIG. 5, is merely one such example, and the scope of claimed subject matter is not limited in these respects. For one or more embodiments, a computing platform may comprise any of a wide range of digital electronic devices, including, but not limited to, personal desktop or notebook computers, high-definition televisions, digital versatile disc (DVD) players or recorders, game consoles, satellite television receivers, cellular telephones, personal digital assistants, mobile audio or video playback or recording devices, and so on. Further, unless specifically stated otherwise, a process as described herein, with reference to flow diagrams or otherwise, may also be executed or controlled, in whole or in part, by a computing platform.

Reference throughout this specification to "one embodiment" or "an embodiment" may mean that a particular feature, structure, or characteristic described in connection with a particular embodiment may be included in at least one embodiment of claimed subject matter. Thus, appearances of the phrase "in one embodiment" or "an embodiment" in various places throughout this specification are not necessarily intended to refer to the same embodiment or to any one particular embodiment described. Furthermore, it is to be understood that particular features, structures, or characteristics described may be combined in various ways in one or more embodiments. In general, of course, these and other issues may vary with the particular context of usage. Therefore, the particular context of the description or the usage of these terms may provide helpful guidance regarding inferences to be drawn for that context.

Likewise, the terms, "and," "and/or," and "or" as used herein may include a variety of meanings that also is expected to depend at least in part upon the context in which such terms are used. Typically, "or" as well as "and/or" if used to associate a list, such as A, B or C, is intended to mean A, B, and C, here used in the inclusive sense, as well as A, B or C, here used in the exclusive sense. In addition, the term one or more" as used herein may be used to describe any feature, structure, or characteristic in the singular or may be used to describe some combination of features, structures or characteristics. Though, it should be noted that this is merely an illustrative example and claimed subject matter is not limited to this example.

In the preceding description, various aspects of claimed subject matter have been described. For purposes of explanation, systems or configurations were set forth to provide an understanding of claimed subject matter. However, claimed subject matter may be practiced without those specific details. In other instances, well-known features were omitted or simplified so as not to obscure claimed subject matter. While certain features have been illustrated or described herein, many modifications, substitutions, changes or equivalents will now occur to those skilled in the art. It is, therefore, to be understood that the appended claims are intended to cover all such modifications or changes as fall within the true spirit of claimed subject matter.

What is claimed is:

1. A method comprising:
forming a stack of materials that comprises a first electrode material and a second material;
patterning the stack of materials to form a plurality of placeholders that comprise the first electrode material and the second material, wherein the second material comprises a memory material configurable to store information; and
replacing at least a portion of each placeholder of the plurality with a third material to form a plurality of vias that comprise the third material, wherein a dimension of a via of the plurality is based at least in part on a dimension of a respective placeholder of the plurality.

2. The method of claim 1, further comprising:
patterning the stack of materials to form a plurality of first lines that comprise the first electrode material and the second material, wherein forming the plurality of placeholders and forming the plurality of first lines are based at least in part on a same etching operation.

3. The method of claim 1, further comprising:
depositing an encapsulating material in an area that includes the plurality of placeholders.

4. The method of claim 3, where replacing at least the portion of each placeholder with the third material comprises:
removing the second material from each placeholder to form a plurality of etched areas within the encapsulating material; and
depositing the third material into the plurality of etched areas.

5. The method of claim 4, wherein:
the dimension of the via of the plurality is based at least in part on a dimension of a respective etched area of the plurality; and
the dimension of the respective etched area of the plurality is based at least in part on the dimension of the respective placeholder of the plurality.

6. The method of claim 1, further comprising:
forming a second electrode material on the stack of materials, wherein the plurality of vias are between the second electrode material and the first electrode material;
patterning the stack of materials to form a plurality of second lines that comprise the second electrode material, wherein the via of the plurality is included in a respective second line of the plurality.

7. The method of claim 6, wherein patterning the stack of materials to form the plurality of placeholders comprises:
patterning the stack of materials to form a plurality of first lines that comprise the first electrode material, wherein the plurality of first lines extend in a first direction and the plurality of second lines extend in a second direction.

8. A method, comprising:
forming, based at least in part on a first patterning operation, a plurality of lines and a plurality of placeholders for vias, wherein the plurality of lines comprise a first electrode material and a second material, and wherein the plurality of placeholders comprise the second material, wherein the second material comprises a memory material configurable to store information; and
forming a plurality of vias defined at least in part by the plurality of placeholders.

9. The method of claim 8, wherein forming the plurality of vias comprises:
forming a dielectric material at least partially surrounding each of the plurality of placeholders;
removing at least a portion of each of the plurality of placeholders to form a plurality of holes in the dielectric material; and
forming a via material in each of the plurality of holes.

10. The method of claim 9, wherein forming the plurality of vias further comprises:
planarizing a surface of the dielectric material prior to removing at least the portion of each of the plurality of placeholders.

11. The method of claim 8, wherein forming the plurality of placeholders comprises:
forming a plurality of line segments, wherein the plurality of lines extend in a first direction and the plurality of line segments extend in a second direction.

12. The method of claim 11, further comprising:
forming a second electrode material in contact with the plurality of vias;
forming, based at least in part on a second patterning operation, a plurality of second lines that extend in the second direction.

13. The method of claim 12, wherein a via of the plurality has a dimension based at least in part on a dimension of a second line of the plurality.

14. The method of claim 8, wherein a via of the plurality has a dimension based at least in part on a dimension of a placeholder of the plurality.

15. The method of claim 8, wherein forming the plurality of lines and the plurality of placeholders comprises etching the first electrode material and the second material.

16. A method, comprising:
forming a plurality of line segments that comprise a placeholder material, wherein the placeholder material comprises a memory material configurable to store information;
surrounding the plurality of line segments with an encapsulating material;
removing the placeholder material from the plurality of line segments to form a plurality of holes in the encapsulating material;
depositing a via material in the plurality of holes to form a plurality of vias in contact with a first conductive material; and
depositing a second conductive material over the encapsulating material and the plurality of vias, wherein the second conductive material is in contact with the plurality of vias.

17. The method of claim 16, wherein the plurality of line segments include the first conductive material, further comprising:
forming, concurrent with forming the plurality of line segments, a plurality of lines that include the first conductive material.

18. The method of claim 16, further comprising:
forming, after depositing the second conductive material, a plurality of lines that include the second conductive material, wherein the plurality of vias are coupled with the plurality of lines.

* * * * *